(12) United States Patent
Lai et al.

(10) Patent No.: US 8,710,545 B2
(45) Date of Patent: Apr. 29, 2014

(54) LATCH-UP FREE ESD PROTECTION

(75) Inventors: Da-Wei Lai, Singapore (SG); Handoko Linewih, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 104 days.

(21) Appl. No.: 13/533,959

(22) Filed: Jun. 26, 2012

(65) Prior Publication Data

US 2013/0341675 A1    Dec. 26, 2013

(51) Int. Cl.
  *H01L 29/74* (2006.01)
(52) U.S. Cl.
  USPC ............. 257/173; 257/355; 257/E27.11
(58) Field of Classification Search
  USPC ............................. 257/173, 355, E27.11
  See application file for complete search history.

(56) References Cited

U.S. PATENT DOCUMENTS

| 6,759,691 | B2 * | 7/2004 | Chen ............................ 257/107 |
| 7,875,902 | B2 * | 1/2011 | Kodama et al. ............... 257/107 |
| 2013/0187231 | A1 * | 7/2013 | Lai et al. ....................... 257/355 |

* cited by examiner

*Primary Examiner* — Minh-Loan T Tran
(74) *Attorney, Agent, or Firm* — Horizon IP Pte. Ltd.

(57) ABSTRACT

An ESD module having a first portion (FP) and a second portion (SP) in a substrate is presented. The FP includes a FP well of a second polarity type and first and second FP contact regions. The first FP contact region is of a first polarity type and the second FP contact region is of a second polarity type. The SP includes a SP well of a first polarity type and first and second SP contact regions. The first SP contact region is of a first polarity type and the second SP contact region is of a second polarity type. An intermediate portion (IP) is disposed in the substrate between the FP and SP in the substrate. The IP includes a well of the second polarity type. The IP increases trigger current and holding voltage of the module to prevent latch up during normal device operation.

20 Claims, 6 Drawing Sheets

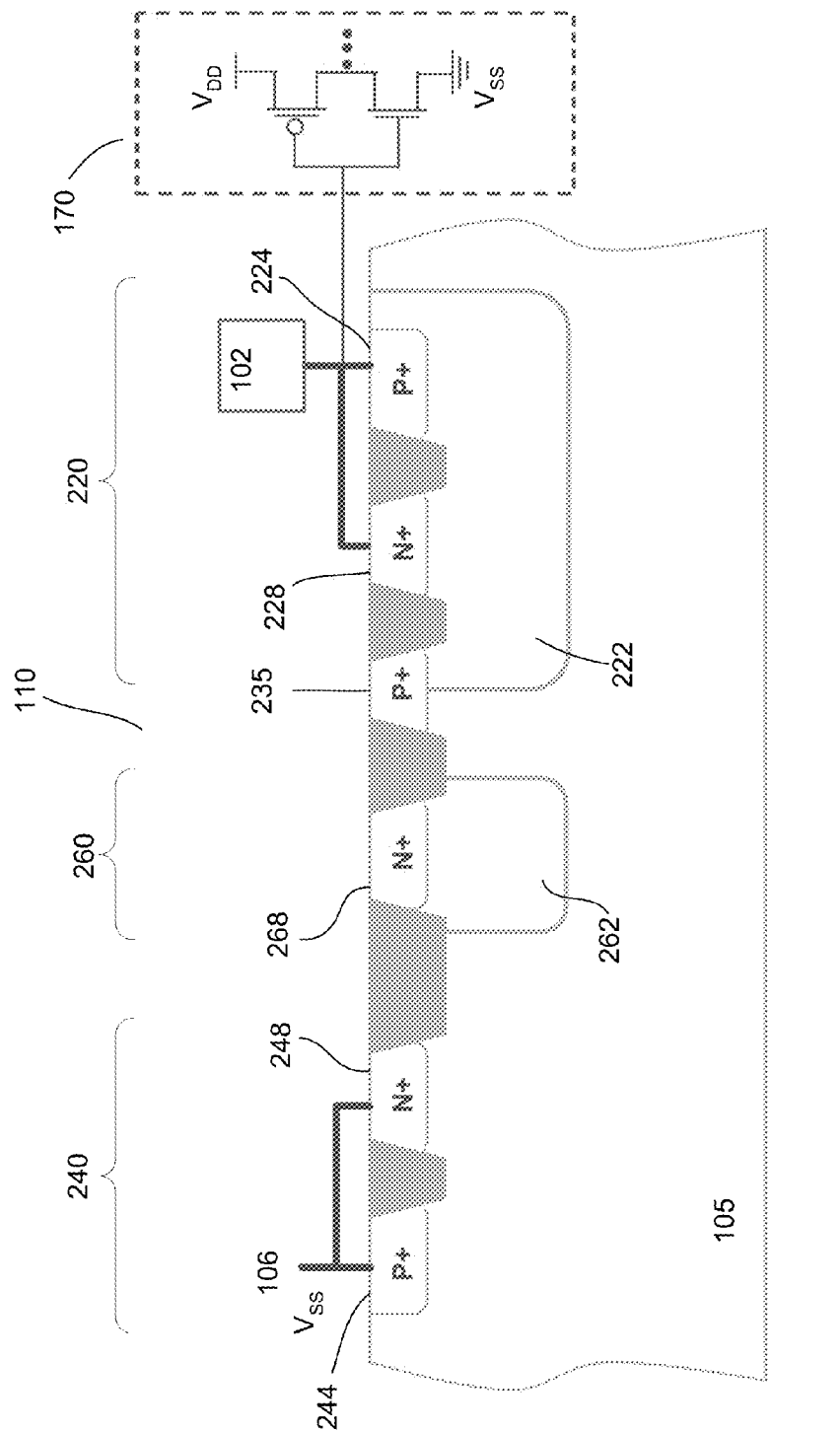

LATCH-UP FREE ESD PROTECTION

BACKGROUND

Electrostatic discharge (ESD) generated from static electricity is usually characterized by fast transient high voltage discharge. An ESD event can occur in electrical and electronic circuits, such as an integrated circuit (IC). It can create sufficiently high voltage to cause destructive breakdown of devices connected to, for example, the inputs and/or outputs of the integrated circuits.

An approach to protect ICs from ESD is to use a silicon controlled rectifier (SCR). However, conventional SCR circuits are subject to latch up during normal IC operation. Latch up affects the operation of the IC, rendering it defective.

Therefore, it is desirable to have an ESD protection circuit which can be quickly triggered to avoid damaging internal circuits and immune to latch up during normal operation.

SUMMARY

An ESD module is presented. The ESD module includes a first portion (FP) in a substrate. The FP includes a FP well of a second polarity type and first and second FP contact regions. The first FP contact region is a first polarity type FP contact region and the second FP contact region is a second polarity type FP contact region. The ESD module also includes a second portion (SP) in the substrate. The SP includes a SP well of a first polarity type and first and second SP contact regions. The first SP contact region is a first polarity type SP contact region and the second SP contact region is a second polarity type SP contact region. An intermediate portion (IP) is disposed in the substrate between the first and second portions in the substrate. The IP includes an IP well of the second polarity type. The intermediate portion increases trigger current and holding voltage of the ESD module to prevent latch up during normal device operation.

In another embodiment, an ESD module is disclosed. The ESD module includes a first portion (FP), a second portion (SP) and an intermediate portion (IP) in a substrate. The FP includes a FP well of a second polarity type and first, second and third FP contact regions. The first and third FP contact regions are first polarity type FP contact regions. The second FP contact region is a second polarity type FP contact region. The SP includes a SP well of a first polarity type and first and second SP contact regions. The first SP contact region is a first polarity type SP contact region and the second SP contact region is a second polarity type SP contact region. The IP is disposed between the FP and SP in the substrate. The IP includes an IP well of the second polarity type. The IP increases trigger current and holding voltage of the ESD module to prevent latch up during normal device operation.

In yet another embodiment, a method of forming a device is presented. The method includes providing a substrate prepared with an ESD module. The ESD module includes a first portion (FP) in a substrate. The FP includes a FP well of a second polarity type and first and second FP contact regions. The first FP contact region is a first polarity type FP contact region and the second FP contact region is a second polarity type FP contact region. The ESD module also includes a second portion (SP) in the substrate. The SP includes a SP well of a first polarity type and first and second SP contact regions. The first SP contact region is a first polarity type SP contact region and the second SP contact region is a second polarity type SP contact region. The ESD module also includes an intermediate portion (IP) disposed in the substrate between the FP and SP in the substrate. The IP includes an IP well of the second polarity type. The IP increases trigger current and holding voltage of the ESD module to prevent latch up during normal device operation.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-d show embodiments of a portion of a device;

DETAILED DESCRIPTION

Embodiments generally relate to semiconductor devices. In one embodiment, the devices include an ESD circuit. The ESD circuit, for example, is activated during an ESD event to dissipate high current. The devices, for example, may be any type of semiconductor devices, such as integrated circuits (ICs). The ICs can be incorporated into or used with, for example, electronic products, computers, displays, cell phones, and personal digital assistants (PDAs). The devices may also be incorporated into other types of products.

FIGS. 1a-d show cross-sectional views of embodiments of a portion of a device 100. Referring to FIGS. 1a-d, the device is formed in a semiconductor substrate 105. The substrate, in one embodiment, is a silicon substrate. Other types of semiconductor substrates, including semiconductor-on-insulator substrates, may also be useful. The substrate, in one embodiment, may be a lightly doped silicon substrate with first polarity type dopants. The lightly doped substrate may have a dopant concentration of about $1.7e15$ $cm^{-3}$. Other doping concentrations may also be useful. In one embodiment, the second polarity type may be p-type. For example, the substrate may be a lightly doped p-type substrate. Providing an intrinsic or n-doped substrate may also be useful. P-type dopants, for example, include boron (B), aluminum (Al), indium (In) or a combination thereof, while n-type dopants can include phosphorus (P), arsenic (As), antimony (Sb) or a combination thereof.

The device includes an ESD module 110. The ESD module may include an isolation region (not shown) to isolate the ESD module. The isolation region, for example, may surround the ESD module. The isolation region may be a trench isolation region. The isolation region, for example, is a shallow trench isolation (STI) region. Other types or configurations of isolation regions may also be useful.

Figure 1A:
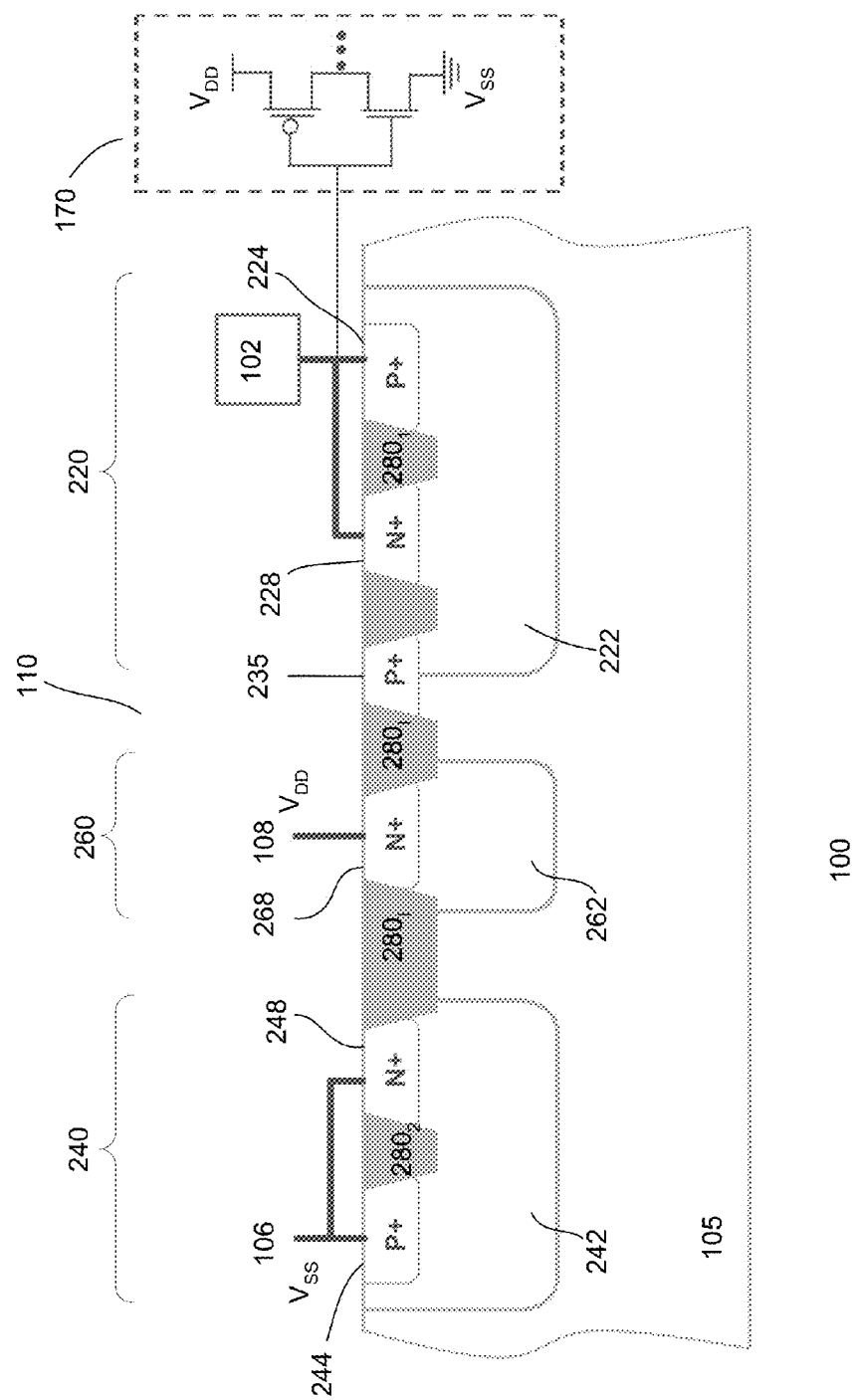
Figure 1B:
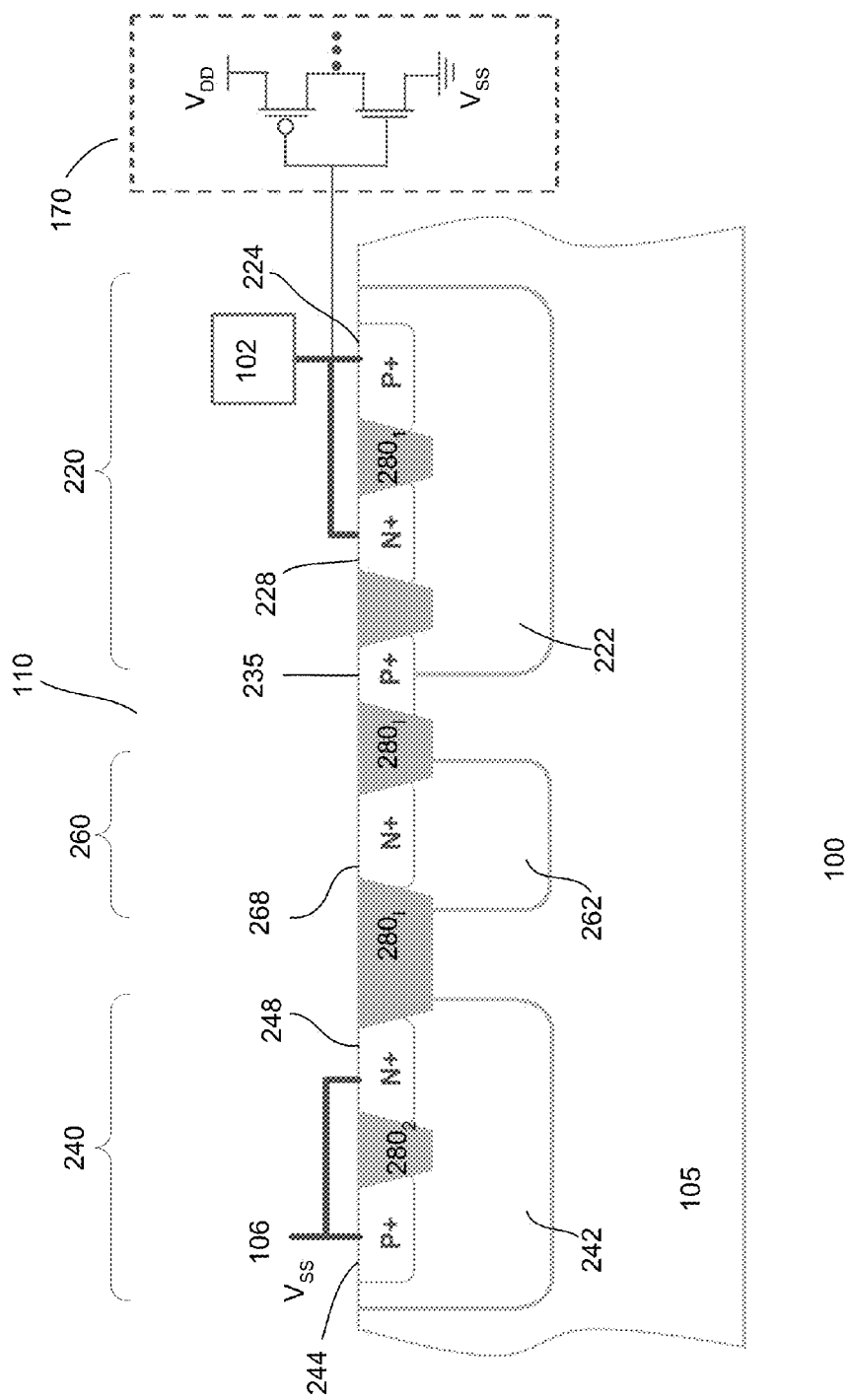
Figure 1C:
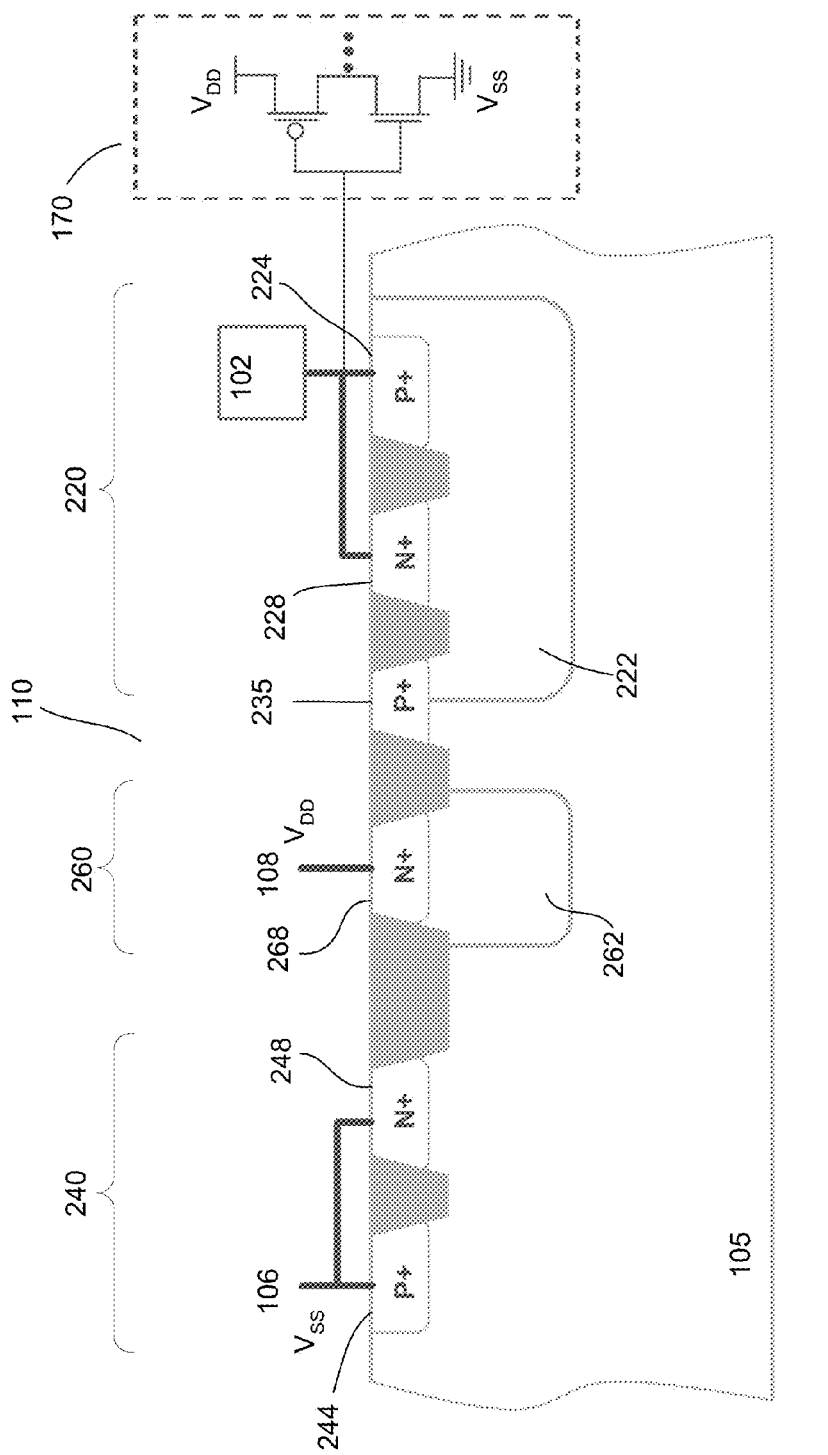

The ESD module, in one embodiment, is a silicon-controlled rectifier (SCR) based ESD module. In accordance with one embodiment, the ESD module includes an intermediate portion (IP) 260 between a first portion (FP) 220 and a second portion (SP) 240. The portions serve as terminals of the ESD module. For example, first, second and third terminals 102, 106 and 108 are coupled to FP, SP and IP. In one embodiment, the first terminal is coupled to a pad. The pad, for example, is an I/O pad of the device. As for the second terminal, it is coupled to a low power source. The low power source, for example, is ground or $V_{SS}$. In one embodiment, the third terminal is coupled to a high power source, as shown in FIG. 1a and FIG. 1c. The high power source, for example, is $V_{DD}$. For example, the third terminal biases the IP. In other embodiments, as shown in FIG. 1b and FIG. 1d, the IP is floated or unbiased. Other types of power sources or configurations of couplings for the terminals may also be useful.

Referring back to FIGS. 1a-d, an internal circuit 170 is coupled to the pad. The internal circuit, for example, is an I/O circuit, such as an inverter. Other types of internal circuits may also be coupled to the pad. The internal circuit is coupled between the high and low power sources, such as $V_{DD}$ and $V_{SS}$.

In one embodiment, the FP includes a FP well 222. The FP well is doped with second polarity type dopants. The IP includes an IP well 262. Similar to the FP well, the IP well includes second polarity type dopants. As for SP, in one embodiment, it includes a SP well 242, as shown in FIG. 1a-b. The SP well is doped with first polarity type dopants. For example, the substrate may be intrinsic or lightly doped with the same polarity type dopants as the SP well and opposite to the FP and IP wells. The wells are preferably intermediately doped wells. Providing lightly doped wells may also be useful. For example, the wells may have a dopant concentration of about 1e15-1e17 $cm^{-3}$. Other dopant concentrations may also be useful. Higher dopant concentrations decrease the trigger voltage for the ESD module.

In some embodiments, a combination of lightly and intermediately doped wells may be provided. In one embodiment, the SP well may be a lightly doped well while the FP and IP wells are intermediately doped wells. In the case where the substrate is a lightly doped first polarity type well, the substrate may serve as the SP well. For example, when a lightly doped p-type substrate is used, the SP well may be the substrate, as shown in FIGS. 1c-d. Other configurations of wells may also be useful.

Referring back to FIGS. 1a-d, the wells are laterally displaced from each other, providing separation regions between the wells. The lateral direction is the direction along or parallel to the surface of the substrate. The separation region may be provided by the substrate. An intermediate isolation region $280_1$ may be provided between the wells. For example, the intermediate isolation regions may be disposed in the separation regions. The intermediate isolation region, for example, surrounds the intermediate portion. Other configurations of isolation regions may also be useful. In some embodiments, no intermediate isolation region is provided. In such embodiments, the wells are separated by the substrate. In the case where the SP well is provided by the substrate, as shown in FIGS. 1c-d, no separation is provided between the SP and IP wells.

Referring back to FIGS. 1a-d, the FP includes first and second FP contact regions 224 and 228. The first FP contact region is a first polarity type contact region and the second FP contact region is a second polarity type contact region. Having the first FP contact region being a second polarity type contact region and the second FP contact region being a first polarity type contact region may also be useful. The first and second FP contact regions serve as contact regions for the first terminal. For example, the first and second FP contact regions are commonly coupled to the pad or power rail ($V_{DD}$).

In one embodiment, the FP includes a third FP contact region 235. The third FP contact region is disposed partially within a FP region and in contact with the substrate between the FP and IP. The third FP contact region is a first polarity type contact region. In one embodiment, FP isolation regions $280_1$ separate the FP contact regions. In other embodiments, no FP isolation region separates the FP contact regions. For example, the FP contact regions may be separated by the substrate. The FP contact regions may also be butt contact regions.

As for the SP, it includes first and second SP contact regions 244 and 248. The first SP contact region is a first polarity type contact region and the second SP contact region is a second polarity type contact region. Having the first SP contact region being a second polarity type contact region and the second SP contact region being a first polarity type contact region may also be useful. The first and second FP contact regions serve as contact regions for the second terminal. For example, the first and second FP contact regions are coupled to the low power source, such as $V_{SS}$. In one embodiment, a SP isolation region $280_2$ separates the first and second SP contact regions. In other embodiments, no SP isolation region separates the first and second SP contact regions. For example, the first and second SP contact regions may be separated by the substrate. The first and second SP contact regions may also be butt contact regions.

The IP portion, in one embodiment, includes an IP contact region 268. The IP contact region is a second polarity type contact region. For example, the IP contact region is the same polarity type as the IP well. The IP contact region serves as a contact region to the third terminal. For example, the IP contact region is coupled to the high power source, such as $V_{DD}$. In the case where the IP portion is floated, no IP contact region is needed.

The contact regions, in one embodiment, are heavily doped regions. For example, the contact regions have a dopant concentration of about 1e19-1e20 $cm^{-3}$. Providing contact regions of other dopant concentrations may also be useful. Furthermore, metal silicide contacts may be provided on the surface of the contact regions. The silicide contacts, for example, reduce contact resistance.

As shown, the first and second contact regions of FP and SP are disposed such that the second contact regions are adjacent to the IP. It is understood that other configurations of the first and second contact regions may also be useful. For example, the positions of the contact regions may be interchangeable.

Furthermore, isolation regions are shown with different widths. It is understood that the drawings may not be in drawn scale. The dimensions of the isolation regions may be designed according to, for example, isolation requirements. This may mean that the isolation regions may have the same or different widths. In one embodiment, the various elements of the ESD module are compatible with existing processes. For example, the various elements are compatible with existing complementary metal oxide semiconductor (CMOS) processes. For example, the isolation regions, doped wells and contact regions have the same or similar parameters as those used in existing processes. As such, the ESD module can be formed with the device without additional process steps. In other embodiments, the various components of the ESD module may be customized as required by design requirements.

The IP and third FP contact regions decrease the trigger voltage of the ESD module. This results in quick triggering to prevent or reduce potential damage to internal circuits caused by an ESD event. Additionally, the IP and third FP contact regions increase the trigger current for the ESD module, preventing latch up during normal operation. Furthermore, the size of the ESD module can be sufficiently small to fit within a bond pad area. This produces a robust ESD module without increasing chip size.

Figure 2:
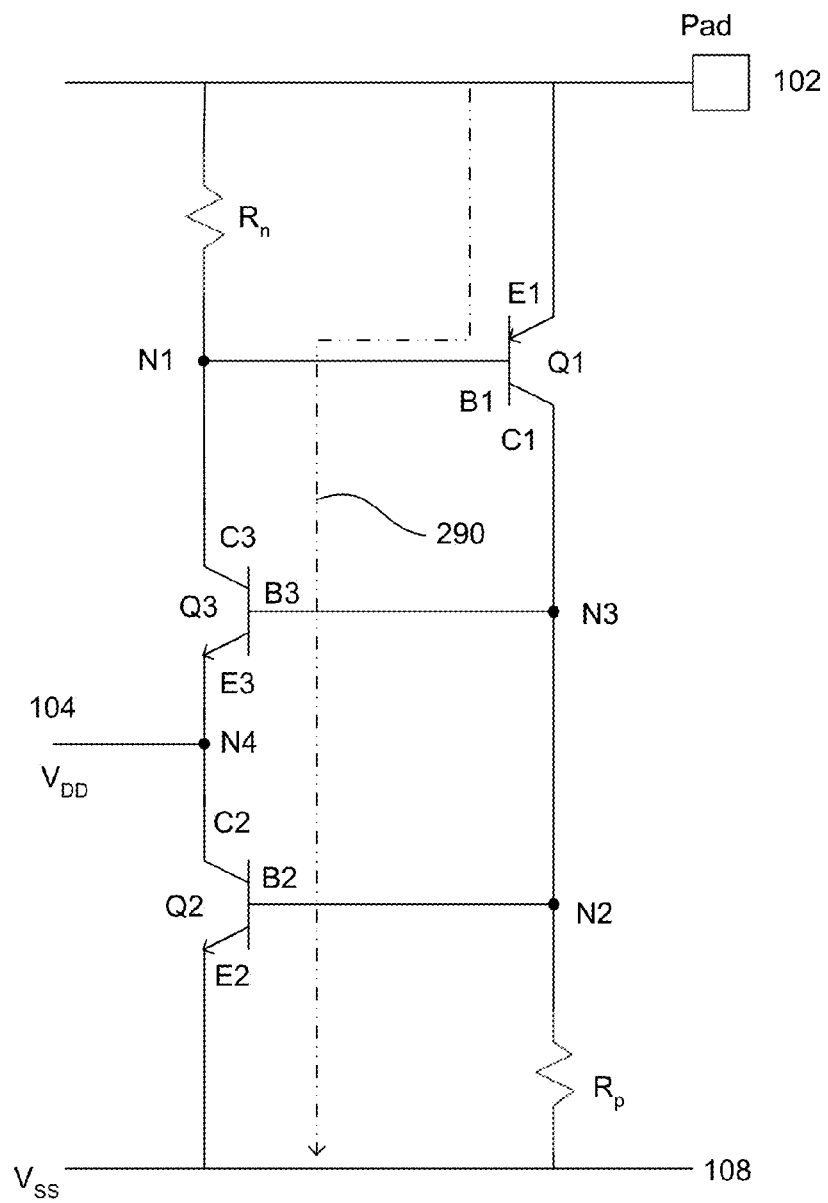
FIG. 2 shows a parasitic circuit of an embodiment of an ESD module.

A simplified circuit diagram of a parasitic circuit 200 of the ESD module is provided in FIG. 2. Referring to FIGS. 1a-d and FIG. 2, the parasitic circuit includes first, second and third bipolar junction transistor (BJT) Q1, Q2 and Q3 between the pad 102 and the low power source 108.

The first transistor Q1 includes a first emitter terminal E1, a first base terminal B1 and a first collector terminal C1. Similarly, Q2 includes a second emitter terminal E2, a second base terminal B2 and a second collector terminal C2; Q3 includes a third emitter terminal E3, a third base terminal B3 and a third collector terminal C3. In one embodiment, Q1 is a pnp transistor while Q2 and Q3 are npn transistors.

In one embodiment, E1 is formed by the first FP contact region. For example, E1 is the heavily doped p-type first FP contact region. The p-type substrate forms C1 while B1 is formed by the n-doped FP well. This produces a first vertical pnp transistor. For example, the vertical pnp transistor is formed along a direction perpendicular to a surface of the substrate. The pad is coupled to E1 while C1 is coupled to the low power source by a second resistor Rp formed by the p-type substrate or the p-doped SP well. As for the base, it is coupled to the pad by a first resistor Rn formed by the n-doped FP well. The connection between B1 and Rn forms a first node N1.

As shown, Q2 and Q3 are coupled in series between the pad and the low power source. For example, C3 is coupled to N1, E3 is coupled to C2 and E2 is coupled to the low power source. In one embodiment, C3 is formed by the n-doped FP well, B3 is formed by the p-type substrate and E3 is formed by the n-doped IP well. This forms a third lateral npn transistor. For example, the third lateral transistor is parallel to the substrate surface. C2 is formed by the n-doped IP well, B2 is formed by the p-type substrate or p-doped SP well while E2 is formed by the n-doped second SP contact region. The low power source is coupled to E2, and coupled to B2 and B3 by the second resistor Rp. The connection between B2 and Rp forms a second node N2 and the connection between B3 and C1 forms a third node N3.

As for the connection between E3 and C2, it forms a fourth node N4. In one embodiment, N4 is coupled to a high power source, such as $V_{DD}$. In other embodiments, N4 is floated.

As illustrated, due to the IP well, the parasitic circuit is a pnpnpn structure. Under normal operation (e.g., no ESD event), the ESD module does not form a current path in the pnpnpn structure. For example, no current path is formed from the pad to the low and high power sources. In one embodiment, the PN junction formed by B1 and C1 is reverse biased. This prevents any current paths from being formed in the ESD module. As such, the ESD module does not affect the operation of the protected device or circuit.

On the other hand, an ESD event causes the ESD circuit to form a current path, as indicated by arrow 290, in the pnpnpn structure to release ESD stress. For example, the current path allows TLP current to dissipate to the low power source.

Figure 3:
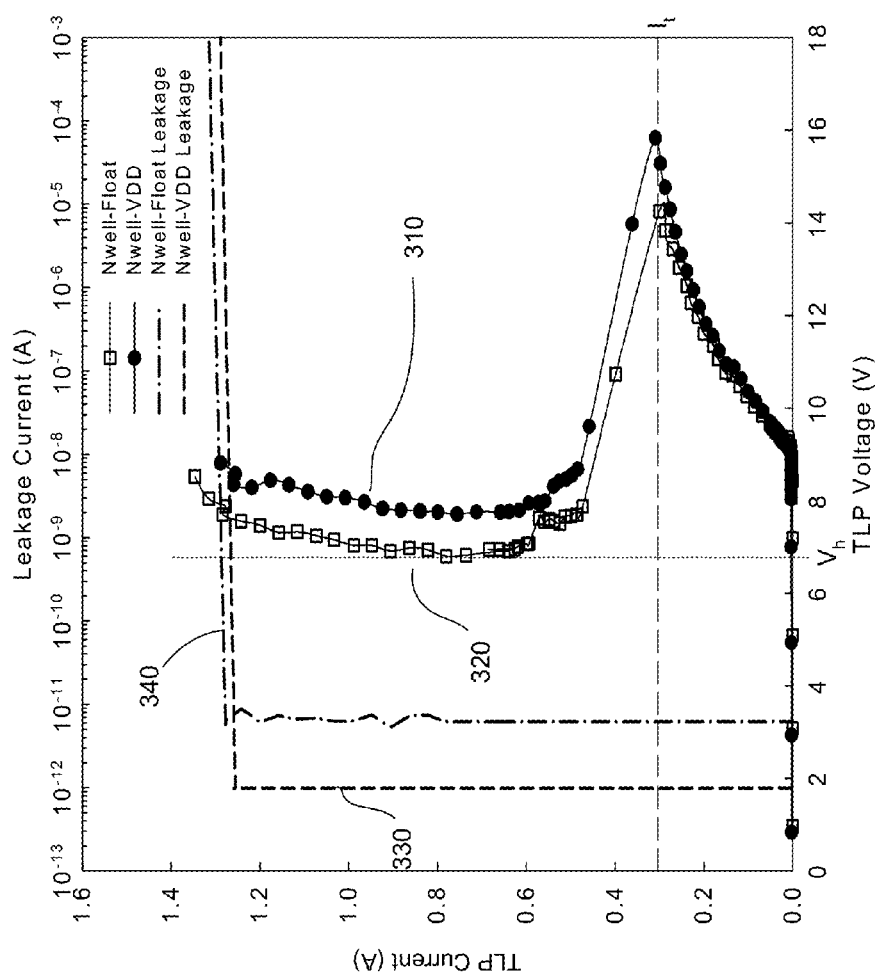
FIG. 3 shows an operating curve of an embodiment of an ESD module.

FIG. 3 shows IV curves of embodiments of SCR-based ESD modules using 100 ns pulse width TLP. Curve 310 corresponds to a SCR-based ESD module having the IP well biased at 3.3 V; curve 320 corresponds to a SCR-based ESD module with the IP well unbiased. From the curves, the ESD-based modules have a high trigger current $I_t$, for example, about 300 mA and high holding voltage $V_h$ of at least about 6.7 V in the case of an unbiased IP well. The holding voltage can be increased to about 8 V by biasing the IP well with, for example, $V_{DD}$ of 3.3 V. Since $I_t$ is >200 mA and $V_h$ is greater than the device operating voltage, the ESD module is immune to latch-up during normal operations.

Not to be bound by theory, it is believed that the IP well, which creates an additional parasitic BJT, causes the current to go deeper into the substrate. This results in a higher trigger current.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. An ESD module comprising:
    a first portion (FP) in a substrate, the FP includes a FP well of a second polarity type and first and second FP contact regions, the first FP contact region is a first polarity type FP contact region and the second FP contact region is a second polarity type FP contact region;
    a second portion (SP) in the substrate, the SP includes a SP well of a first polarity type and first and second SP contact regions, the first SP contact region is a first polarity type SP contact region and the second SP contact region is a second polarity type SP contact region;
    an intermediate portion (IP) disposed in the substrate between the FP and SP in the substrate, the IP includes an IP well of the second polarity type; and
    wherein the IP increases trigger current and holding voltage of the ESD module to prevent latch up during normal device operation.

2. The ESD module of claim 1 wherein the first polarity type is p-type and the second polarity type is n-type.

3. The ESD module of claim 1 comprises a silicon control rectifier based (SCR) based ESD module.

4. The ESD module of claim 1 wherein the FP includes a third FP contact region being a first polarity type FP contact region.

5. The ESD module of claim 4 wherein the third FP contact region is disposed partially within the FP and in contact with the substrate between the FP and IP.

6. The ESD module of claim 1 wherein the FP is coupled to a pad.

7. The ESD module of claim 6 wherein the first and second FP contact regions are commonly coupled to the pad.

8. The ESD module of claim 1 wherein the IP is coupled to a high power source, $V_{DD}$.

9. The ESD module of claim 8 wherein the IP comprises an IP contact region being a second polarity type IP contact region.

10. The ESD module of claim 9 wherein the IP contact region is coupled to the high power source, $V_{DD}$.

11. The ESD module of claim 1 wherein the SP is coupled to a low power source, $V_{SS}$.

12. The ESD module of claim 11 wherein the first and second SP contact regions are commonly coupled to low power source, $V_{SS}$.

13. The ESD module in claim 1 comprises a parasitic circuit, wherein the parasitic circuit comprises first, second and third bipolar junction transistors (BJTs), wherein the first BJT is a pnp transistor and the second and third BJTs are npn transistors.

14. The ESD module in claim 13 wherein the first BJT comprises:
    a first emitter coupled to a pad;

a first collector coupled to a low power source by a second resistor Rp formed by the SP well; and a first base coupled to the pad by a first resistor Rn formed by the FP well, the connection between the first base and Rn forms a first node N1.

15. The ESD module in claim 14 wherein the second BJT comprises:
a second emitter formed by the second SP contact region, the second emitter is coupled to the low power source;
a second base formed by the SP well, the second base is coupled to the low power source; and
a second collector formed by the IP well.

16. The ESD module in claim 15 wherein the third BJT comprises:
a third emitter formed by the IP well, the third emitter is coupled to the second collector;
a third base formed by the substrate, the third base is coupled to the low power source;
a third collector formed by the FP well, the third collector is coupled to the first node N1.

17. An ESD module comprising:
a first portion (FP) in a substrate, the FP includes a FP well of a second polarity type and first, second and third FP contact regions, the first and third FP contact regions are first polarity type FP contact regions, the second FP contact region is a second polarity type FP contact region;
a second portion (SP) in the substrate, the SP includes a SP well of a first polarity type and first and second SP contact regions, the first SP contact region is a first polarity type SP contact region and the second SP contact region is a second polarity type SP contact region;
an intermediate portion (IP) disposed in the substrate between the FP and SP in the substrate, the IP includes an IP well of the second polarity type; and
wherein the IP increases trigger current and holding voltage of the ESD module to prevent latch up during normal device operation.

18. The ESD module of claim 17 wherein the FP is coupled to a pad.

19. The ESD module of claim 17 wherein the IP is coupled to a high power source, $V_{DD}$.

20. A method of forming a device comprising:
providing a substrate prepared with an ESD module, wherein the ESD module comprises
a first portion (FP) in a substrate, the FP includes a FP well of a second polarity type and first and second FP contact regions, the first FP contact region is a first polarity type FP contact region and the second FP contact region is a second polarity type FP contact region,
a second portion (SP) in the substrate, the SP includes a SP well of a first polarity type and first and second SP contact regions, the first SP contact region is a first polarity type SP contact region and the second SP contact region is a second polarity type SP contact region,
an intermediate portion (IP) disposed in the substrate between the FP and SP in the substrate, the IP includes an IP well of the second polarity type, and
wherein the IP increases trigger current and holding voltage of the ESD module to prevent latch up during normal device operation.

* * * * *